(12) United States Patent
Huang

(10) Patent No.: US 10,424,535 B2
(45) Date of Patent: *Sep. 24, 2019

(54) PRE-MOLDED LEADFRAME DEVICE

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,244

(22) Filed: May 11, 2018

(65) Prior Publication Data
US 2019/0181074 A1 Jun. 13, 2019

(30) Foreign Application Priority Data
Dec. 11, 2017 (TW) .............................. 106218342 U

(51) Int. Cl.
| | |
|---|---|
| *H01L 23/495* | (2006.01) |
| *H01L 23/48* | (2006.01) |
| *H01L 23/498* | (2006.01) |
| *H01L 33/48* | (2010.01) |
| *H01L 33/62* | (2010.01) |
| *H01L 21/48* | (2006.01) |
| *H01L 33/60* | (2010.01) |

(52) U.S. Cl.
CPC .... *H01L 23/49513* (2013.01); *H01L 21/4828* (2013.01); *H01L 21/4839* (2013.01); *H01L 23/48* (2013.01); *H01L 23/49537* (2013.01); *H01L 23/49558* (2013.01); *H01L 23/49582* (2013.01); *H01L 23/49861* (2013.01); *H01L 33/486* (2013.01); *H01L 33/62* (2013.01); *H01L 33/60* (2013.01); *H01L 2933/005* (2013.01); *H01L 2933/0066* (2013.01)

(58) Field of Classification Search
CPC ......... H01L 23/49513; H01L 23/49582; H01L 23/49558; H01L 23/49537; H01L 21/4839; H01L 21/4828
See application file for complete search history.

(56) References Cited

U.S. PATENT DOCUMENTS

2017/0229625 A1* 8/2017 Hsieh ...................... H01L 33/60

* cited by examiner

*Primary Examiner* — Anthony Ho
(74) *Attorney, Agent, or Firm* — Burris Law, PLLC

(57) ABSTRACT

A pre-molded leadframe device includes a leadframe and a first molding layer. The leadframe includes a plurality of leadframe units spaced apart from one another, a framing portion surrounding and spaced apart from all of the leadframe units, and a gap interposed among the leadframe units and the framing portion. Each of the leadframe units has a leadframe top surface and a leadframe bottom surface. The first molding layer fills the gap and has a molding-layer bottom surface that is coplanar with the leadframe bottom surfaces. The first molding layer is further formed with a plurality of solder grooves, each of which extends across the gap and having at least one end connected to one of the leadframe units.

16 Claims, 13 Drawing Sheets

PRE-MOLDED LEADFRAME DEVICE

CROSS-REFERENCE TO RELATED APPLICATION

This application claims priority of Taiwanese Utility Model Patent Application No. 106218342, filed on Dec. 11, 2017.

FIELD

The disclosure relates to a leadframe device, and more particularly to a pre-molded leadframe device having a plurality of solder grooves.

BACKGROUND

Along with the microminiaturization trend of electronic devices, semiconductor device packages are manufactured to be multifunctional, with increased packaging density and decreased production cost. For instance, a light emitting diode (LED) device has been widely used as a light source to replace a conventional light source, such as an incandescent lamp, due to its micronized size, enhanced energy efficiency, prolonged service life, and shortened response time. However, further improvements in shortening the response time and enhancing the reliability of LED device packages are still being pursued in the field of semiconductor device packaging.

For the purpose of increasing the packaging density and decreasing the packaging size, a conventional semiconductor device package with a quad flat no-lead (QFN) lead frame is provided with solder joints on a bottom surface of the QFN lead frame. However, when the solder joints of the conventional semiconductor device packages are intended for electrically connecting outwardly to external components, quality of the solder joints and completeness of electrical connection between the solder joints and the external components cannot be inspected simply by visual inspection.

SUMMARY

Therefore, an object of the disclosure is to provide a pre-molded leadframe device that can alleviate at least one of the drawbacks of the prior art.

According to the disclosure, the pre-molded leadframe device includes a leadframe and a first molding layer.

The leadframe includes a plurality of leadframe units that are spaced apart from one another, a framing portion that surrounds and is spaced apart from all of the leadframe units, and a gap that is interposed among the leadframe units and the framing portion. Each of the leadframe units has a leadframe top surface adapted to support a semiconductor chip, and a leadframe bottom surface opposite to the leadframe top surface.

The first molding layer fills the gap and has a molding-layer bottom surface that is coplanar with the leadframe bottom surfaces of the leadframe units. The first molding layer is further formed with a plurality of solder grooves, each of which extends across the gap and is indented from the molding-layer bottom surface. Each of the solder grooves has at least one end connected to one of the leadframe units.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
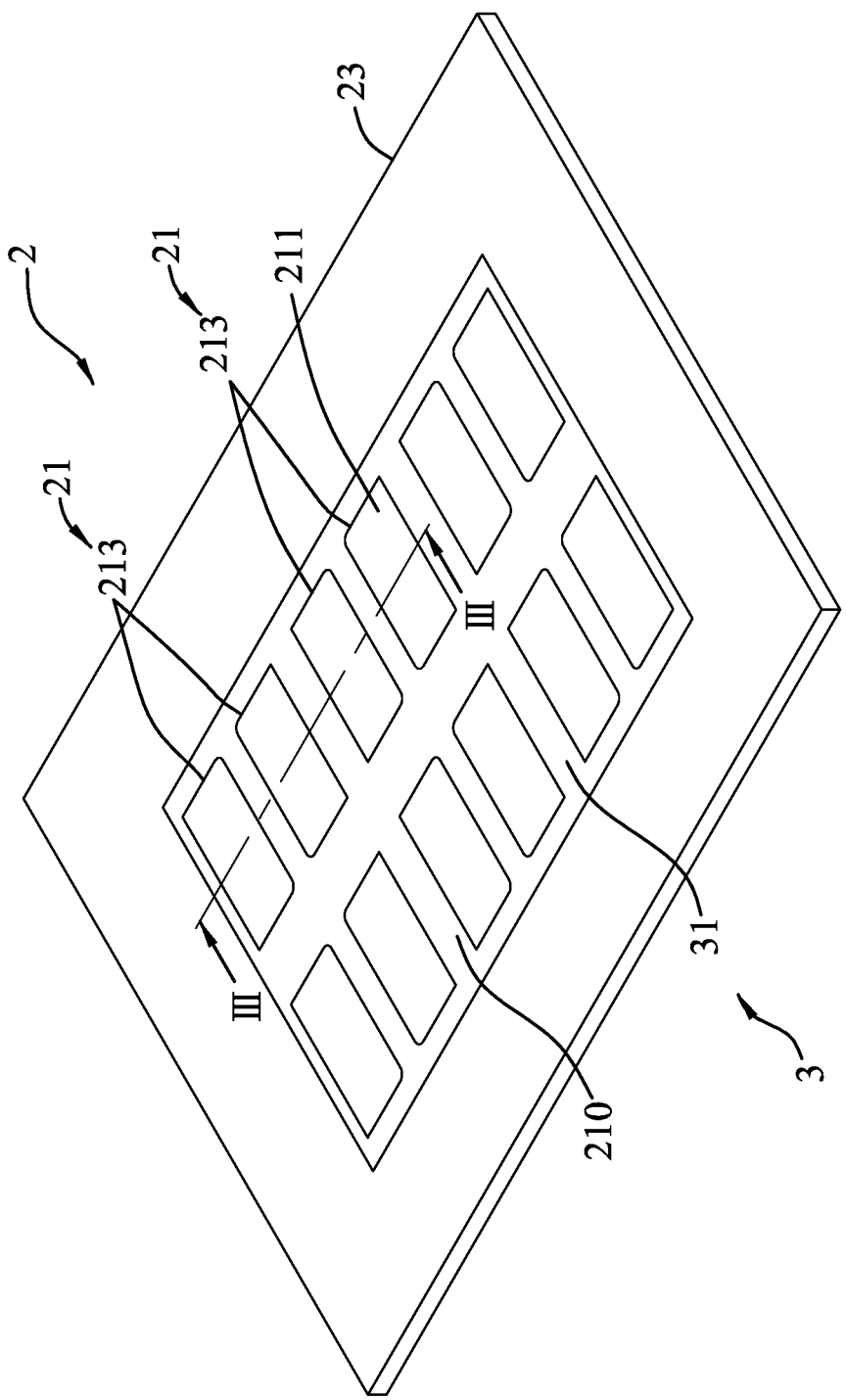
FIG. 1 is a top perspective view illustrating a first embodiment of a pre-molded leadframe device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
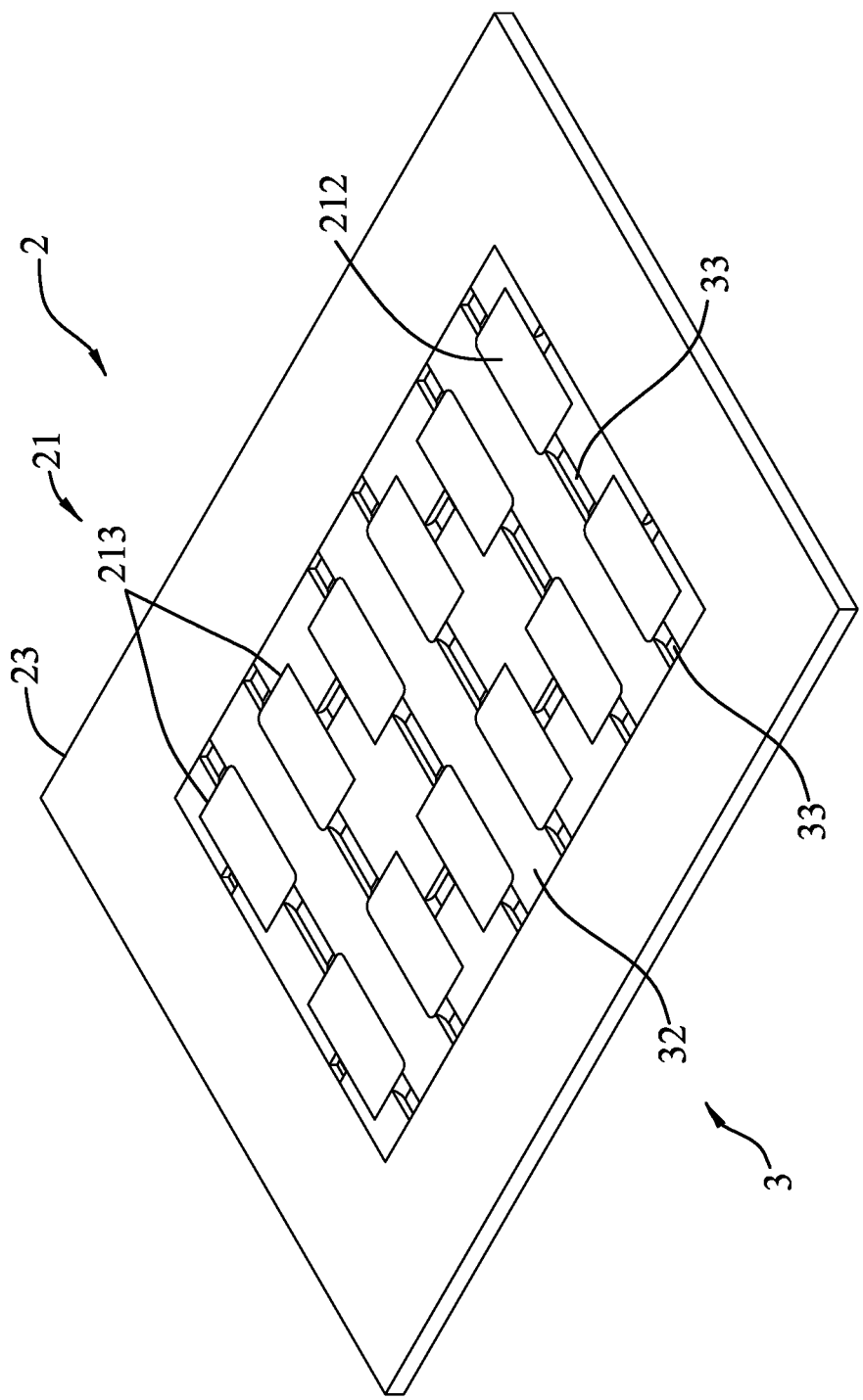
FIG. 2 is a bottom perspective view illustrating the first embodiment.
Figure 3:
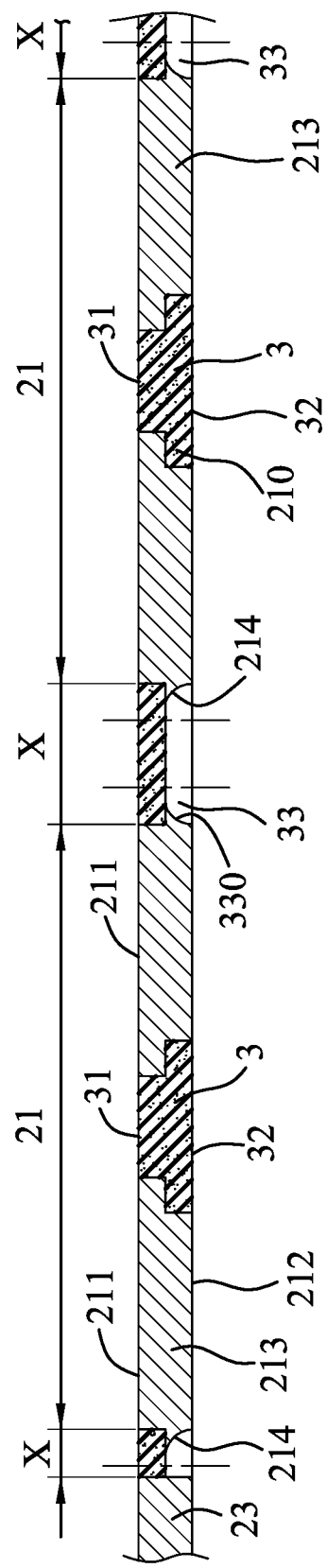
FIG. 3 is a cross-sectional schematic view taken along line III-III of FIG. 1.

Referring to FIGS. 1 to 3, a first embodiment of a pre-molded leadframe according to the disclosure, which is adapted for packaging semiconductor chips (not shown), such as light emitting diode (LED) chips or integrated circuit (IC) chips, is illustrated. The pre-molded leadframe includes a leadframe 2 and a first molding layer 3.

The leadframe 2 is made of a metallic material selected from the group consisting of copper, a copper-based alloy, an iron-nickel alloy, and combinations thereof. The leadframe 2 includes a plurality of leadframe units 21 that are spaced apart from one another, a framing portion 23 that surrounds and is spaced apart from all of the leadframe units 21, and a gap 210 that is interposed among the leadframe units 21 and the framing portion 23. The leadframe units 21 may be arranged in an array. Each of the leadframe units 21 has a leadframe top surface 211 adapted to support at least one of the semiconductor chips, and a leadframe bottom surface 212 opposite to the leadframe top surface 211.

More specifically, referring to FIGS. 5A to 5D, each of the leadframe units 21 includes at least two contact electrodes 213 that are spaced apart from each other by the gap 210. In each of the leadframe units 21, the contact electrodes 213 have bottom surfaces 212' that cooperatively form the leadframe bottom surface 212 and top surfaces 211' that cooperatively form the leadframe top surface 211. At least one of the top surfaces 211' of at least one of the contact electrodes 213 of the leadframe units 21 is adapted to support the semiconductor chip (not shown). In the first embodiment, the number of the contact electrodes 213 of each of the leadframe units 21 is exemplified to be two.

The first molding layer 3 fills the gap 210, such that the leadframe units 21 and the framing portion 23 are connected to one another through the first molding layer 3, and the leadframe bottom surface 212 and the leadframe top surface 211 of the leadframe units 21 are exposed outwardly from the first molding layer 3.

More specifically, the first molding layer 3 is directly molded over the leadframe 2. The first molding layer 3 has a molding-layer bottom surface 32 that is coplanar with the leadframe bottom surfaces 212 of the leadframe units 21 of the leadframe 2, and a molding-layer top surface 31 that is coplanar with the leadframe top surfaces 211 of the leadframe units 21. The first molding layer 3 is further formed with a plurality of solder grooves 33 each of which extends horizontally and across the gap 210, and is indented from the molding-layer bottom surface 32. Each of the solder grooves 33 has at least one end 330 that is connected to one of the leadframe units 21. Each of the contact electrodes 213 is connected to at least one of the solder grooves 33. In the first embodiment, each of the solder grooves 33 has two of the ends 330 opposite to each other. For each of the solder grooves 33 formed between the framing portion 23 and the leadframe units 21, one of the two ends 330 is connected to a respective one of the contact electrodes 213, and the other one of the ends 330 is connected to the framing portion 23. For each of the solder grooves 33 formed between one of the contact electrodes 213 of each of the leadframe units 21 and an adjacent one of the contact electrodes 213 of an adjacent one of the leadframe units 21, the two ends 330 of the solder groove 33 are respectively connected to the one and the adjacent one of the contact electrodes 213. The solder grooves 33 are known as solder seen terminal (SST) in the field of semiconductor packaging.

In one form, each of the contact electrodes 213 may have at least one exposed surface 214 exposed from the molding-layer bottom surface 32 within a respective one of the solder grooves 33. The exposed surface 214 of each of the contact electrodes 213 may be a concave or inclined surface, thereby directing flow of a liquid material, such as a conductive adhesive or solder, applied to the molding-layer bottom surfaces 32 of the contact electrodes 213. In the first embodiment, the exposed surfaces 214 of the contact electrodes 213 are exemplified to be concave. Furthermore, since the molding-layer top surface 31 is coplanar with the leadframe top surfaces 211 of the leadframe units 21, and since the molding-layer bottom surface 32 is coplanar with the leadframe bottom surfaces 212 of the leadframe units 21, the pre-molded leadframe device of the first embodiment is plate-shaped.

Referring to FIG. 3, in the first embodiment, each of the leadframe units 21 includes two of the contact electrodes 213. The gap 210 interposed among the leadframe units 21 and the framing portion 23 that is filled with the first molding layer 3 is adapted to serve as a dicing region (X) and is defined with a scribe line (not shown). After the pre-molded leadframe device has been provided with semiconductor chips (not shown) and packaged, a plurality of semiconductor device packages are singularized by dicing along the scribe line.

Figure 4:
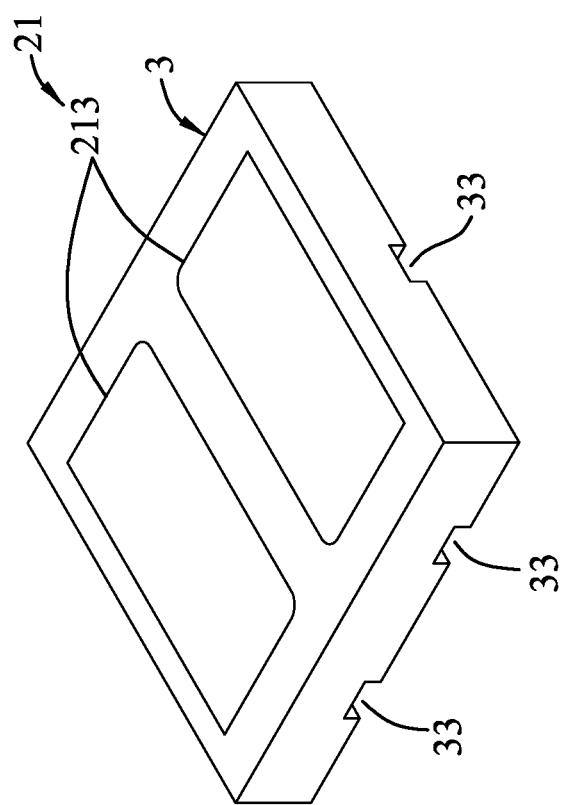
FIG. 4 is a perspective view illustrating a leadframe unit singularized from the first embodiment of the pre-molded leadframe device.

Referring to FIG. 4, each of the singularized semiconductor device packages (only one is shown) includes the leadframe unit 21 surrounded by the first molding layer 3 formed with the solder grooves 33. The quality of solder (not shown) disposed in the solder grooves 33 and connected to the leadframe unit 21 can be visually inspected via the solder grooves 33.

Referring back to FIGS. 5A to 5D, when the first embodiment of the pre-molded leadframe device is manufactured, an electrically conductive substrate made of a material selected from the group consisting of copper, a copper-based alloy, an iron-nickel alloy, and combinations thereof is etched to form a leadframe semi-product 100A.

The leadframe semi-product 100A includes the framing portion 23, a plurality of the spaced-apart leadframe units 21 surrounded by the framing portion 23, and a plurality of spaced-apart connecting portions 102. Each of the leadframe units 21 includes two of the contact electrodes 213 spaced apart from each other. The contact electrodes 213 are arranged in an array, and each of the contact electrodes 213 has the top surface 211' and the bottom surface 212' that is opposite to the top surface 211'. One part of the connecting portions 102 is disposed and connected between one of the contact electrodes 213 of each of the leadframe units 21 and an adjacent one of the contact electrodes 213 of an adjacent one of the leadframe units 21, and the other part of the connecting portions 102 is disposed and connected between the framing portion 23 and adjacent ones of the contact electrodes 213 of the leadframe units 21. Hence, the leadframe semi-product 100A is formed integrally with the framing portion 23 and the leadframe units 21 connected to one another, and is formed with the gap 210 among the framing portion 23 and the leadframe units 21.

Figure 5A:
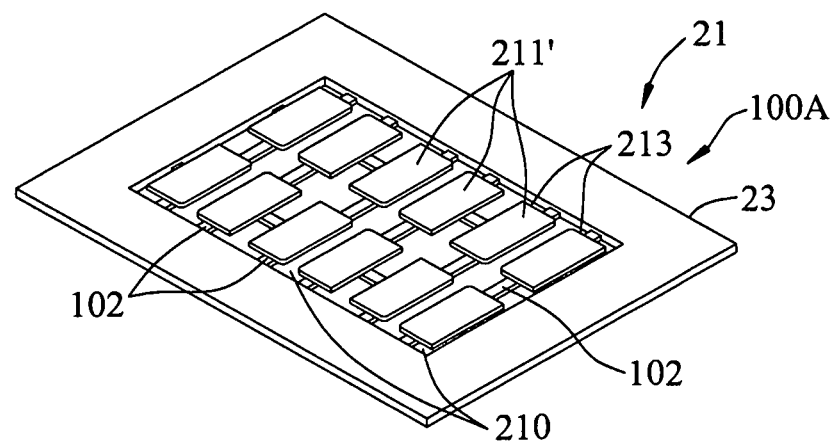
FIGS. 5A to 5D are perspective views illustrating consecutive steps of a method of making the first embodiment of the pre-molded leadframe device.
Figure 5B:
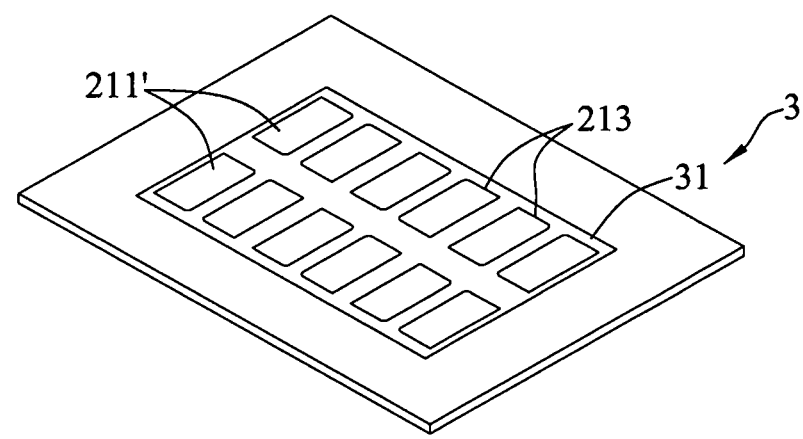
Figure 5C:
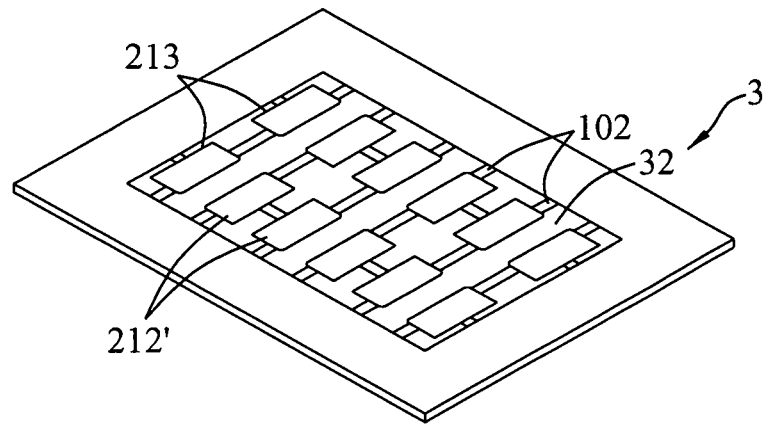

Thereafter, the leadframe semi-product 100A is disposed in a mold (not shown), and then an encapsulating material is filled in the gap 210 and covers the connecting portions 102 without covering the top and bottom surfaces 211', 212' of the contact electrodes 213, followed by curing of the encapsulating material to form the first molding layer 3. FIGS. 5B and 5C are respectively top and bottom views of the leadframe semi-product 100A formed with the first molding layer 3 having the molding-layer top surface 31 and the molding-layer bottom surface 32.

Figure 5D:
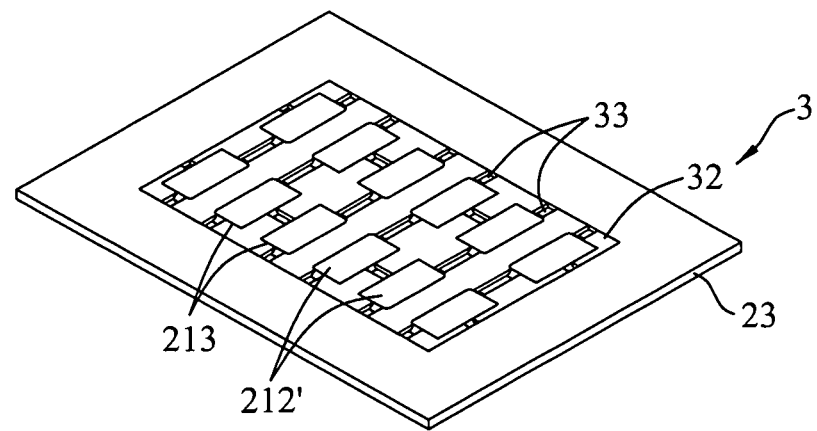

Finally, the connecting portions 102 are etched so as to form the solder grooves 33 that are indented from the molding-layer bottom surface 32 (as shown in FIG. 5D). Thus, the first embodiment of the pre-molded leadframe device is formed.

Figure 6:
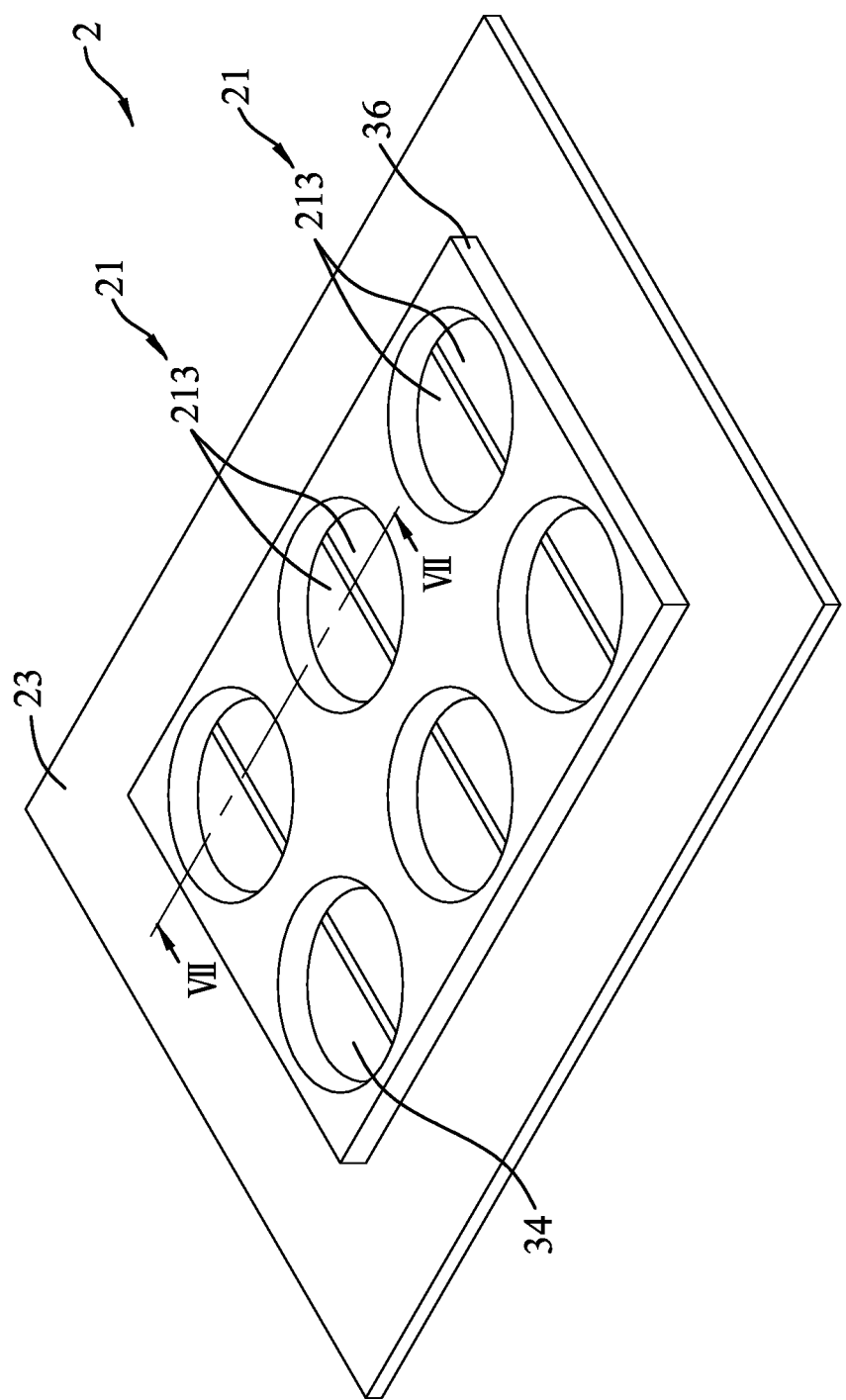
FIG. 6 is a second embodiment of the pre-molded leadframe device according to the disclosure.
Figure 7:
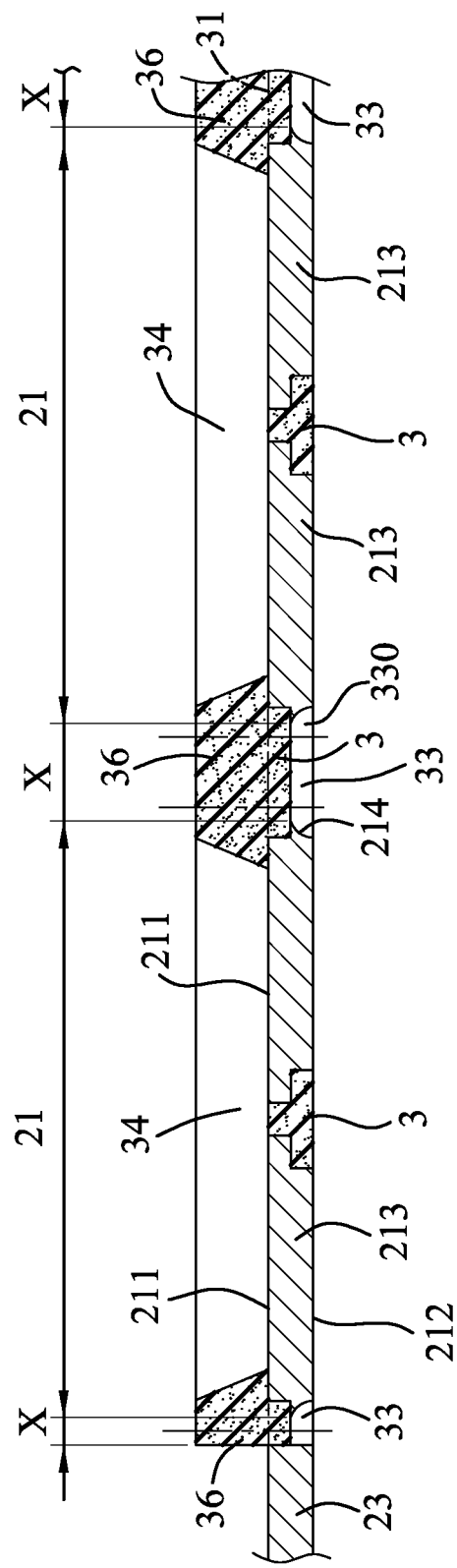
FIG. 7 a cross-sectional schematic view taken along line VII-VII of FIG. 6.

Referring to FIGS. 6 and 7, the second embodiment of the pre-molded leadframe device according to the disclosure is illustrated. The pre-molded leadframe device has a structure similar to that of the first embodiment and further includes a second molding layer 36 formed over the molding-layer top surface 31.

More specifically, the second molding layer 36 partially covers the leadframe top surface 211 of each of the leadframe units 21 and does not cover the framing portion 23. The second molding layer 36 and the leadframe top surfaces 211 exposed from the second molding layer 36 cooperatively define receiving spaces 34 for disposing the semiconductor chips.

In one form, the second molding layer 36 may be light reflective. When the semiconductor chips respectively received in the receiving spaces 34 are light-emitting chips, multiple reflections of light emitted from the light-emitting chips can be generated by the second molding layer 36, and thus light extraction efficiency of the light-emitting chips can be enhanced.

Figure 8:
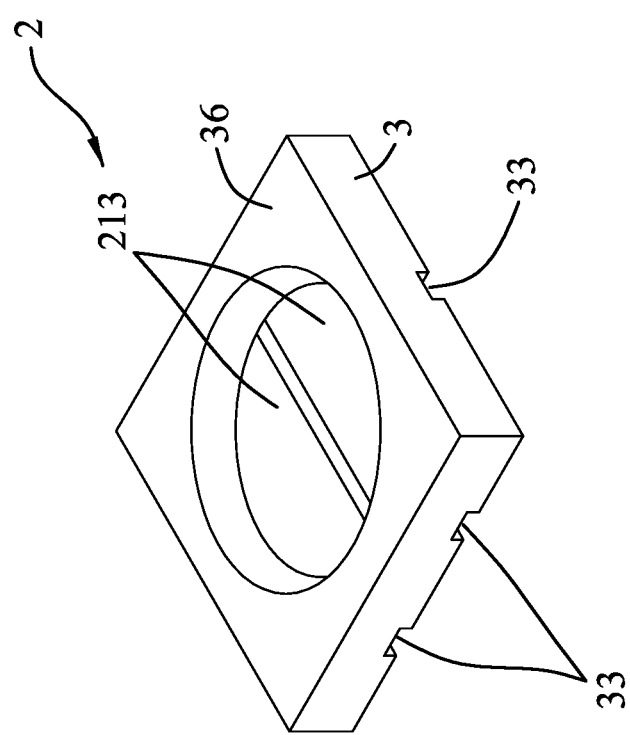
FIG. 8 is a perspective view illustrating a leadframe unit singularized from the second embodiment of the pre-molded leadframe device.

Referring to FIGS. 7 and 8, each of the singularized semiconductor device packages (only one is shown) is diced along the scribe line (not shown) defined in the dicing region (X) of the second embodiment of the pre-molded leadframe device shown in FIG. 7. The semiconductor device package includes the leadframe unit 21 surrounded by the first molding layer 3 formed with the solder grooves 33, and the second molding layer 36 formed on the first molding layer 3 and partially covering the leadframe top surface 211. The quality of solder (not shown) disposed in the solder grooves 33 and connected to the leadframe unit 21 can be likewise inspected visually via the solder grooves 33.

More specifically, the second embodiment of the pre-molded leadframe device shown in FIG. 6 is manufactured in a manner similar to that of the first embodiment, and the mold can be designed such that the first and second molding layers 3, 36 are formed simultaneously and integrally. Alternatively, the first and second molding layers 3, 36 are formed successively in different molds, and may be made from identical or different polymeric encapsulating materials. When the second molding layer 36 is desired to be light reflective, light reflecting particles may be included in the polymeric encapsulating materials for forming the second molding layer 36. Since the mold(s) and the light reflecting particles per se are not the essential features of the disclosure, and are well known to those skilled in the art, further details thereof are not provided herein for the sake of brevity.

It is noted that the first and second embodiments may further include a film-plating process conducted after the formation of the first molding layer 3 (for the first embodiment) or after the formation of both the first and second molding layers 3, 36 (for the second embodiment). At least one electro-plating layer made from a material that is different from that of the leadframe units 21 may be formed on at least one of the leadframe bottom surfaces 212, the leadframe top surfaces 211, or the concave surfaces 214. The electro-plating layer may be made from metal or an alloy. To be specific, the electro-plating layer may be made from the material selected from the group consisting of nickel, palladium, silver, gold, and combinations thereof, and may be a single layer or a multi-layered structure. With the electro-plating layer, adhesion of the pre-molded leadframe device to wires and to an encapsulating material and the reliability of the pre-molded leadframe device can be enhanced in subsequent wire-bonding and encapsulation processes.

Figure 9:
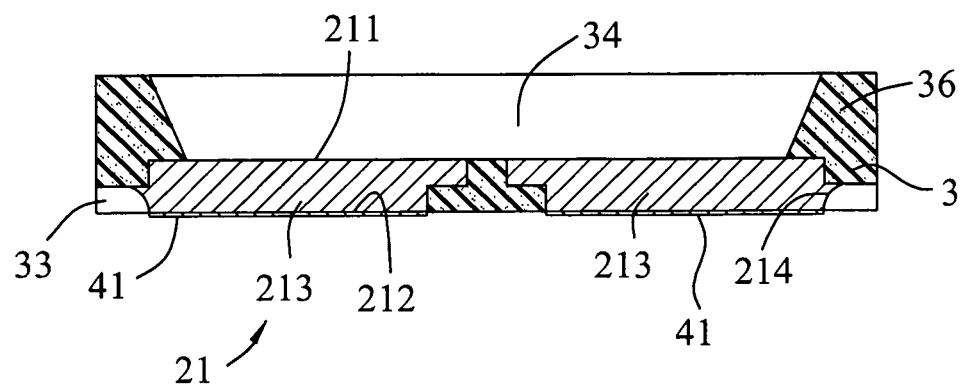
FIG. 9 is a cross-sectional schematic view illustrating the second embodiment further including a bottom electro-plating layer.

Referring to FIG. 9, in one form, the second embodiment of the pre-molded leadframe device further includes a bottom electro-plating layer 41 that is disposed on the leadframe bottom surfaces 212 of the leadframe units 21.

Figure 10:
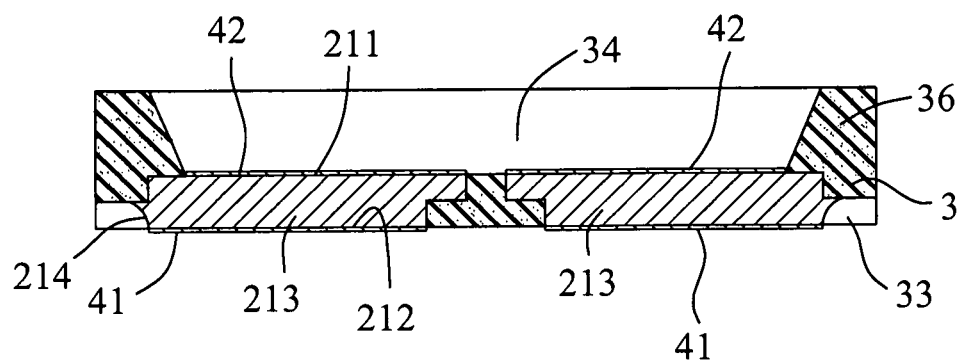
FIG. 10 is a cross-sectional schematic view illustrating the second embodiment of FIG. 9 further including a top electro-plating layer.

Referring to FIG. 10, a top electro-plating layer 42 is disposed on the leadframe top surfaces 211 of the leadframe units 21 shown in FIG. 9 where are not covered by the first and second molding layers 3, 36.

Figure 11:
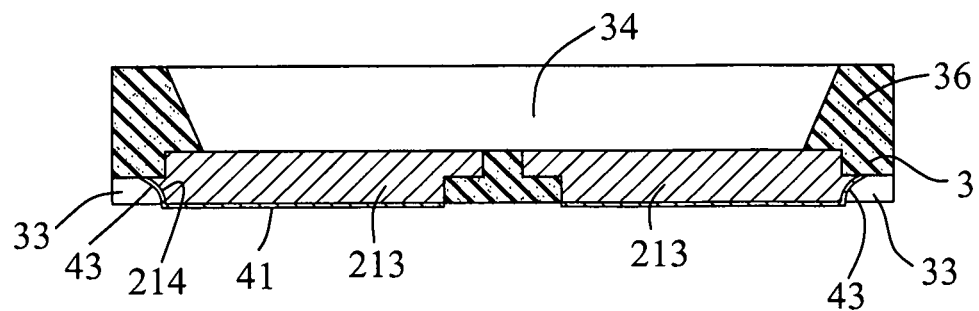
FIG. 11 is a cross-sectional schematic view illustrating the second embodiment of FIG. 9 further including a groove electro-plating layer.

Referring to FIG. 11, the second embodiment of the pre-molded leadframe device shown in FIG. 9 further includes a groove electro-plating layer 43 that is disposed on at least one concave surface 214 of each of the contact electrodes 213.

Figure 12:
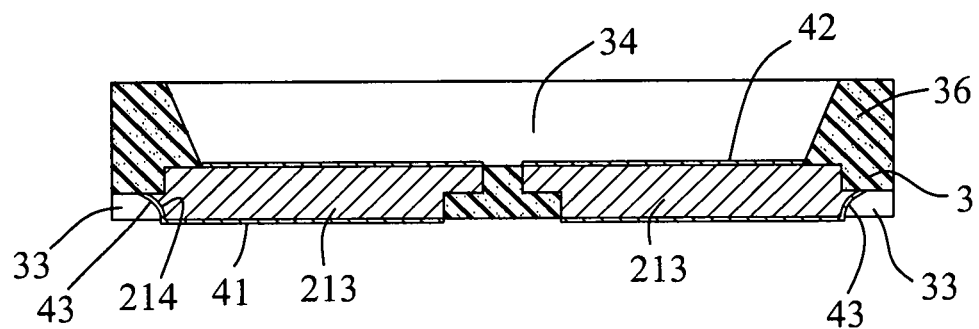
FIG. 12 is a cross-sectional schematic view illustrating the second embodiment of FIG. 10 further including a groove electro-plating layer.
Figure 13:
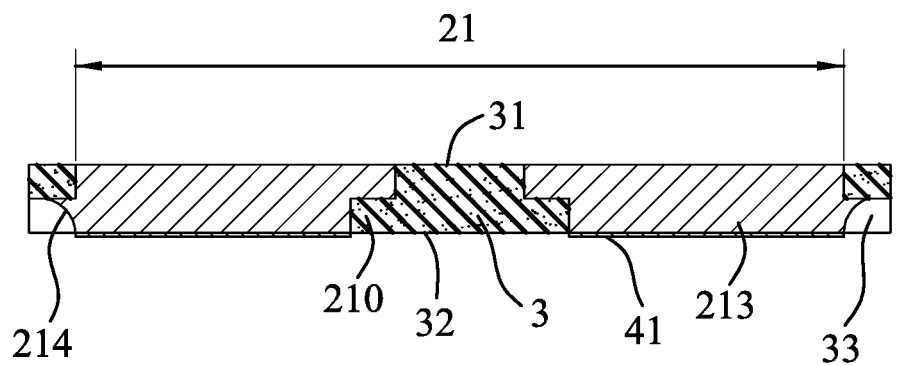
FIG. 13 is a cross-sectional schematic view illustrating the first embodiment further including a bottom electro-plating layer.
Figure 14:
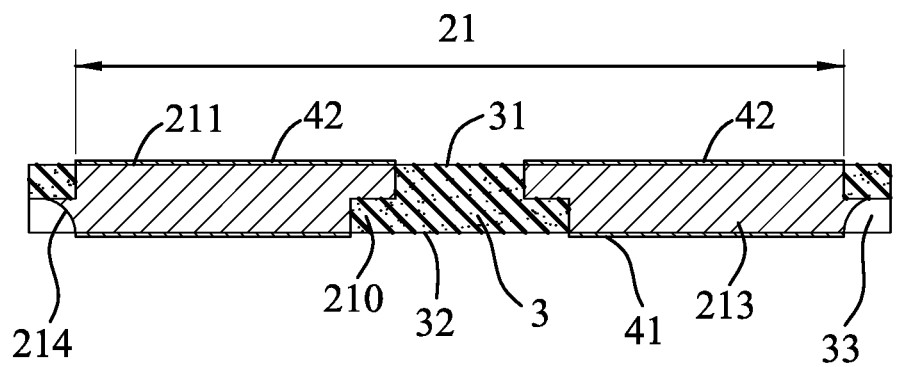
FIG. 14 is a cross-sectional schematic view illustrating the first embodiment of FIG. 13 further including a top electro-plating layer.
Figure 15:
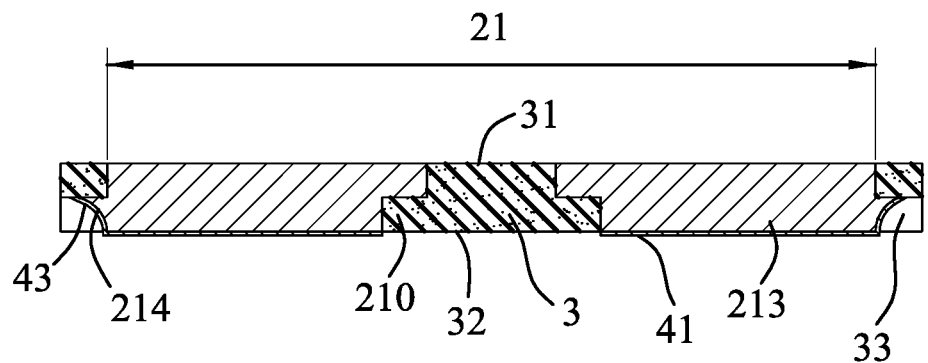
FIG. 15 is a cross-sectional schematic view illustrating the first embodiment of FIG. 13 further including a groove electro-plating layer.
Figure 16:
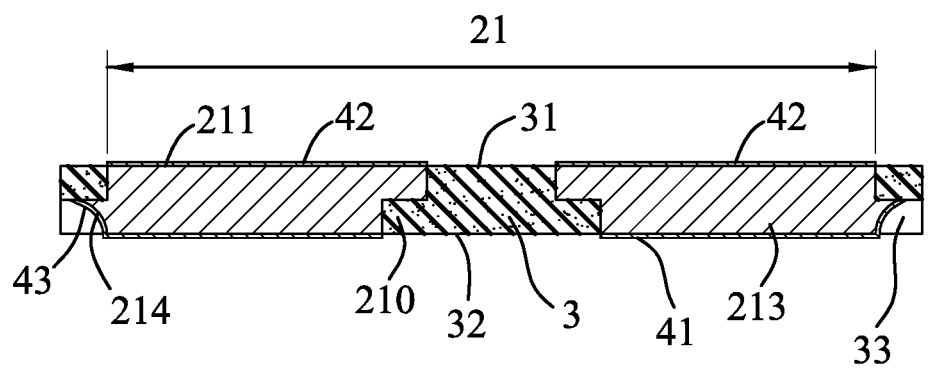
FIG. 16 is a cross-sectional schematic view illustrating the first embodiment of FIG. 14 further including a groove electro-plating layer.

Alternatively, referring to FIG. 12, the groove electro-plating layer 43 may be disposed on the at least one concave surface 214 of each of the contact electrodes 213 of the pre-molded leadframe device shown in FIG. 10.

Referring to FIGS. 13 to 16, the first embodiment of the pre-molded leadframe device may further include the bottom electro-plating layer 41, the top electro-plating layer 42, and/or the groove electro-plating layer 43 in a manner similar to that of the second embodiment. Specifically, the top electro-plating layer 42 is disposed on the leadframe top surfaces 211 of the leadframe units 21 that are coplanar with the molding-layer top surface 31 of the first molding layer 3.

By virtue of the inclusion of the solder grooves 33, for each of the singularized semiconductor device packages made from the pre-molded leadframe device of this disclosure, the quality of soldering and completeness of electrical connection between solder joints formed by soldering and the external components can be inspected visually.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A pre-molded leadframe device, comprising:
   a leadframe including a plurality of leadframe units that are spaced apart from one another, a framing portion that surrounds and is spaced apart from all of said leadframe units, and a gap that is interposed among said leadframe units and said framing portion, each of said leadframe units having a leadframe top surface adapted to support a semiconductor chip, and a leadframe bottom surface opposite to said leadframe top surface; and
   a first molding layer filling said gap, and having a molding-layer bottom surface that is coplanar with said leadframe bottom surfaces of said leadframe units, said first molding layer further formed with a plurality of solder grooves, each of which extends across said gap and is indented from said molding-layer bottom surface, each of said solder grooves having at least one end connected to one of said leadframe units.

2. The pre-molded leadframe device of claim 1, wherein each of said leadframe units includes at least two contact electrodes spaced apart from each other by said gap, each of said contact electrodes being connected to at least one of said solder grooves.

3. The pre-molded leadframe device of claim 2, wherein each of said contact electrodes has at least one concave surface exposed from said molding-layer bottom surface within a respective one of said solder grooves.

4. The pre-molded leadframe device of claim 1, wherein said first molding layer has a molding-layer top surface that is coplanar with said leadframe top surfaces of said leadframe units.

5. The pre-molded leadframe device of claim 4, further comprising a second molding layer formed over said molding-layer top surface of said first molding layer, said second molding layer partially covering said leadframe top surface of each of said leadframe units and not covering said framing portion.

6. The pre-molded leadframe device of claim 5, wherein said second molding layer is light reflective.

7. The pre-molded leadframe device of claim 5, further comprising a bottom electro-plating layer that is disposed on said leadframe bottom surfaces of said leadframe units and that is made from a material different from that of said leadframe units.

8. The pre-molded leadframe device of claim 7, further including a top electro-plating layer that is disposed on said leadframe top surfaces of said leadframe units which are not covered by said first and second molding layers, said top electro-plating layer being made from a material different from that of said leadframe units.

9. The pre-molded leadframe device of claim 8, wherein each of said leadframe units includes at least two contact electrodes spaced apart from each other by said gap, each of said contact electrodes being connected to at least one of said solder grooves, each of said contact electrodes having at least one concave surface exposed from said molding-layer bottom surface within a respective one of said solder grooves, said pre-molded leadframe device further including a groove electro-plating layer that is disposed on said at least one concave surface of each of said contact electrodes and that is made from a material different from that of said leadframe units.

10. The pre-molded leadframe device of claim 7, wherein each of said leadframe units includes at least two contact electrodes spaced apart from each other by said gap, each of said contact electrodes being connected to at least one of said solder grooves, each of said contact electrodes having at least one concave surface exposed from said molding-layer bottom surface within a respective one of said solder grooves, said pre-molded leadframe device further including a groove electro-plating layer that is disposed on said at least one concave surface of each of said contact electrodes and that is made from a material different from that of said leadframe units.

11. The pre-molded leadframe device of claim 4, further comprising a bottom electro-plating layer that is disposed on said leadframe bottom surfaces of said leadframe units and that is made from a material different from that of said leadframe units.

12. The pre-molded leadframe device of claim 11, further including a top electro-plating layer that is disposed on said leadframe top surfaces of said leadframe units, said top electro-plating layer being made from a material different from that of said leadframe units.

13. The pre-molded leadframe device of claim 12, wherein each of said leadframe units includes at least two contact electrodes spaced apart from each other by said gap, each of said contact electrodes being connected to at least one of said solder grooves, each of said contact electrodes having at least one concave surface exposed from said molding layer bottom surface within a respective one of said solder grooves, said pre-molded leadframe device further including a groove electro-plating layer that is disposed on said at least one concave surface of each of said contact electrodes and that is made from a material different from that of said leadframe units.

14. The pre-molded leadframe device of claim 11, wherein each of said leadframe units includes at least two contact electrodes spaced apart from each other by said gap, each of said contact electrodes being connected to at least one of said solder grooves, each of said contact electrodes having at least one concave surface exposed from said molding layer bottom surface within a respective one of said solder grooves, said pre-molded leadframe device further including a groove electro-plating layer that is disposed on said at least one concave surface of each of said contact electrodes and that is made from a material different from that of said leadframe units.

15. The pre-molded leadframe device of claim 1, wherein said leadframe units are made of a metallic material selected from the group consisting of copper, a copper-based alloy, an iron-nickel alloy, and combinations thereof.

16. The preformed leadframe device of claim 1, wherein said first and second molding layers are directly molded over said leadframe units.

* * * * *